United States Patent
Galipeau et al.

(10) Patent No.: US 10,263,599 B2
(45) Date of Patent: Apr. 16, 2019

(54) BULK ACOUSTIC WAVE (BAW) FILTER WITH COUPLED INDUCTORS

(71) Applicant: Qorvo US, Inc., Greensboro, NC (US)

(72) Inventors: Jeff D. Galipeau, Apopka, FL (US); Lawrence A. Carastro, Windermere, FL (US); Scott M. Knapp, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 63 days.

(21) Appl. No.: 15/297,549

(22) Filed: Oct. 19, 2016

(65) Prior Publication Data

US 2017/0179927 A1    Jun. 22, 2017

Related U.S. Application Data

(60) Provisional application No. 62/270,281, filed on Dec. 21, 2015.

(51) Int. Cl.
  *H03H 9/54* (2006.01)
  *H03H 9/60* (2006.01)
  *H03H 7/09* (2006.01)

(52) U.S. Cl.
  CPC ............ *H03H 9/542* (2013.01); *H03H 9/605* (2013.01); *H03H 7/09* (2013.01)

(58) Field of Classification Search
  CPC ........... H03H 9/542; H03H 7/09; H03H 9/605
  USPC ....................................................... 333/189
  See application file for complete search history.

(56) References Cited

U.S. PATENT DOCUMENTS

2015/0222246 A1* 8/2015 Nosaka ............... H03H 9/6483
                                                                   333/187

OTHER PUBLICATIONS

Author Unknown, "B41 Tx / Rx BAW Filter," TriQuint Semiconductor, Part No. TQQ0041E, date unknown, date accessed: Feb. 6, 2017, 2 pages, retreived from: http://www.triquint.com/products/p/TQQ0041E.

* cited by examiner

*Primary Examiner* — Stephen E. Jones
*Assistant Examiner* — Samuel S Outten
(74) *Attorney, Agent, or Firm* — Withrow & Terranova, P.L.L.C.

(57) ABSTRACT

A Bulk Acoustic Wave (BAW) filter includes a series branch coupled between an input node and an output node. The series branch has multiple BAW resonators that are coupled in series, wherein a first series resonator is coupled between a first node and a second node in the series branch. A first shunt resonator is coupled between the first node and a fixed voltage node, such as ground, and a second shunt resonator is coupled between the second node and the fixed voltage node. Further, a first inductor is coupled between the first node and the fixed voltage node, and a second inductor is coupled between the second node and the fixed voltage node. The first inductor and the second inductor are magnetically coupled to one another to generate a virtual inductance between the first node and the second node and in parallel with the first series resonator.

22 Claims, 19 Drawing Sheets

BULK ACOUSTIC WAVE (BAW) FILTER WITH COUPLED INDUCTORS

RELATED APPLICATIONS

This application claims the benefit of provisional patent application Ser. No. 62/270,281, filed Dec. 21, 2015, the disclosure of which is incorporated herein by reference in its entirety.

FIELD OF THE DISCLOSURE

The disclosure relates to Bulk Acoustic Wave (BAW) filters.

BACKGROUND

Acoustic resonators, and particularly Bulk Acoustic Wave (BAW) resonators, are used in many high-frequency communication applications. In particular, BAW resonators are often employed in filter networks that operate at frequencies above 1.5 GHz and require a flat passband; have exceptionally steep filter skirts and squared shoulders at the upper and lower ends of the passband; and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters.

SUMMARY

A Bulk Acoustic Wave (BAW) filter is disclosed. The BAW filter includes a series branch coupled between an input node and an output node. The series branch has multiple BAW resonators that are coupled in series, wherein a first series resonator is coupled between a first node and a second node in the series branch. A first shunt resonator is coupled between the first node and a fixed voltage node, such as ground, and a second shunt resonator is coupled between the second node and the fixed voltage node. Further, a first inductor is coupled between the first node and the fixed voltage node, and a second inductor is coupled between the second node and the fixed voltage node. The first inductor and the second inductor are magnetically coupled to one another to generate a virtual inductance between the first node and the second node and in parallel with the first series resonator. With this configuration, the BAW filter may provide uniquely wide and flat passbands at frequencies above 1.8 GHz. In certain embodiments, the magnetic coupling coefficient, k, for the magnetic coupling between the first inductor and the second inductor is between 0.1 and 1, 0.2 and 1, and 0.3 and 1.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this Specification illustrate several aspects of the disclosure, and together with the description serve to explain the principles of the disclosure.

DETAILED DESCRIPTION

Figure 1:
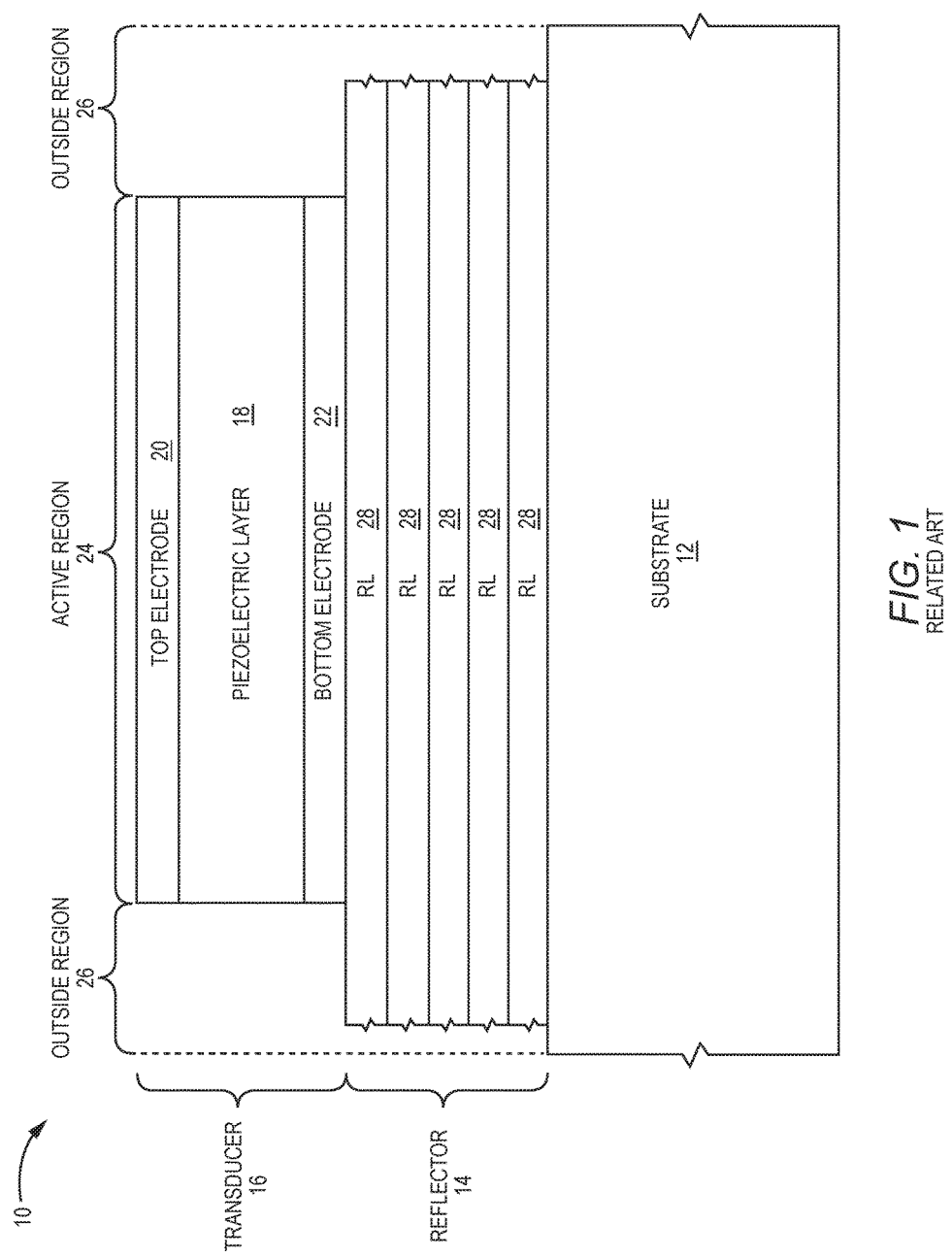
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or "extending onto" another element, it can be directly on or extend directly onto the other element or intervening elements may also be present. In contrast, when an element is referred to as being "directly on" or "extending directly onto" another element, there are no intervening elements present. Likewise, it will be understood that when an element such as a layer, region, or substrate is referred to as being "over" or "extending over" another element, it can be directly over or extend directly over the other element or intervening elements may also be present. In contrast, when an element is referred to as being "directly over" or "extending directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," "having" and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A unique Bulk Acoustic Wave (BAW) filter is disclosed herein. In general, the BAW filter includes a series branch coupled between an input node and an output node. The series branch has multiple BAW resonators that are coupled in series, wherein a first series resonator is coupled between a first node and a second node in the series branch. A first shunt resonator is coupled between the first node and a fixed voltage node, such as ground, and a second shunt resonator is coupled between the second node and the fixed voltage node. Further, a first inductor is coupled between the first node and the fixed voltage node, and a second inductor is coupled between the second node and the fixed voltage node. The first inductor and the second inductor are magnetically coupled to one another to generate a virtual inductance between the first node and the second node and in parallel with the first series resonator. With this configuration, the BAW filter may provide uniquely wide and flat passbands at frequencies above 1.8 GHz. Prior to delving into the details of the BAW filter, an overview of BAW resonators and filters is provided.

Bulk Acoustic Wave (BAW) resonators are used in many high-frequency filter applications. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO) or other appropriate piezoelectric material. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upward are reflected back into the transducer 16 by the air-metal boundary at the top surface of the top electrode 20. Acoustic waves traveling downward are reflected back into the transducer 16 by the reflector 14, or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 will vary from one design to another.

Figure 2:
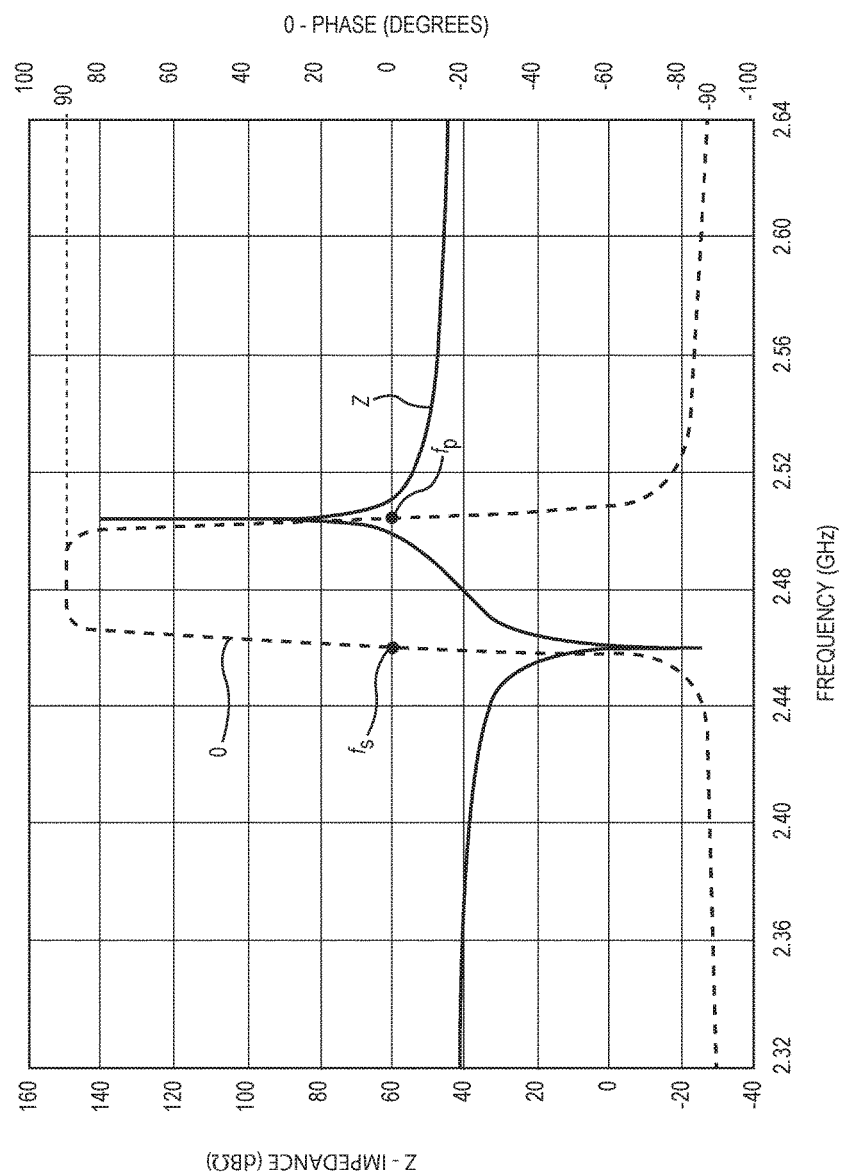
FIG. 2 is a graph of the magnitude and phase of impedance over frequency for an ideal BAW resonator.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, while the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$), and a very high resistance at the parallel resonance frequency ($f_p$). The electrical nature of the BAW resonator 10 lends itself to the realization of a very high Q (quality factor) inductance over a relatively short range of frequencies, which has proven to be very beneficial in high frequency filter networks, especially those operating at frequencies around 1.8 GHz and above.

Figures 3A, 3B, 3C:
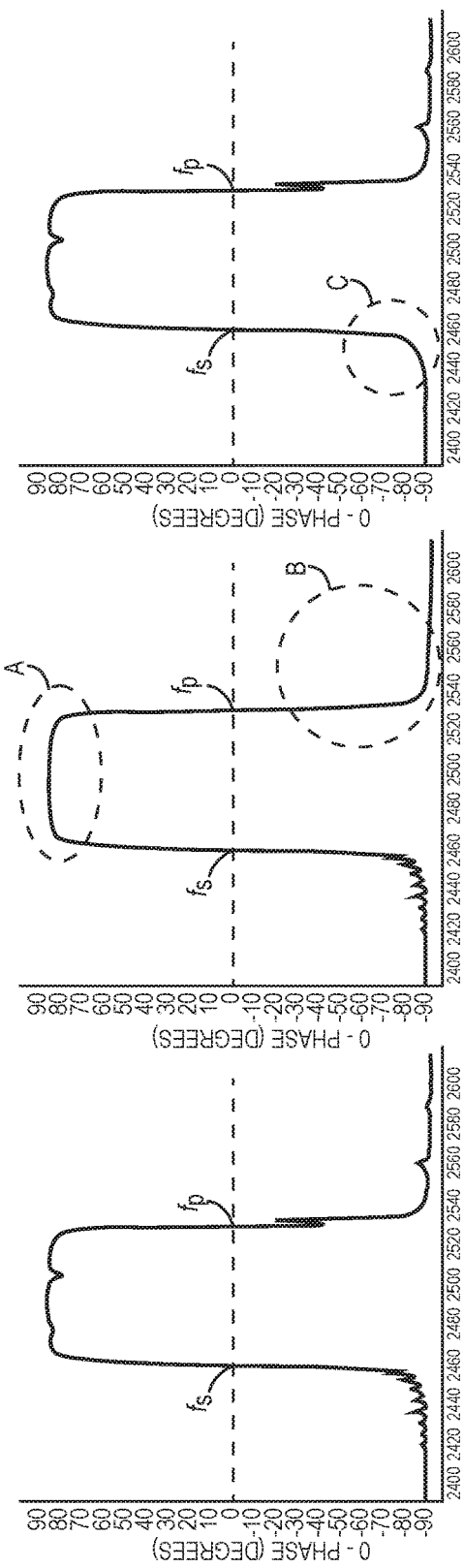
FIGS. 3A-3C are graphs of phase responses for various BAW resonator configurations.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
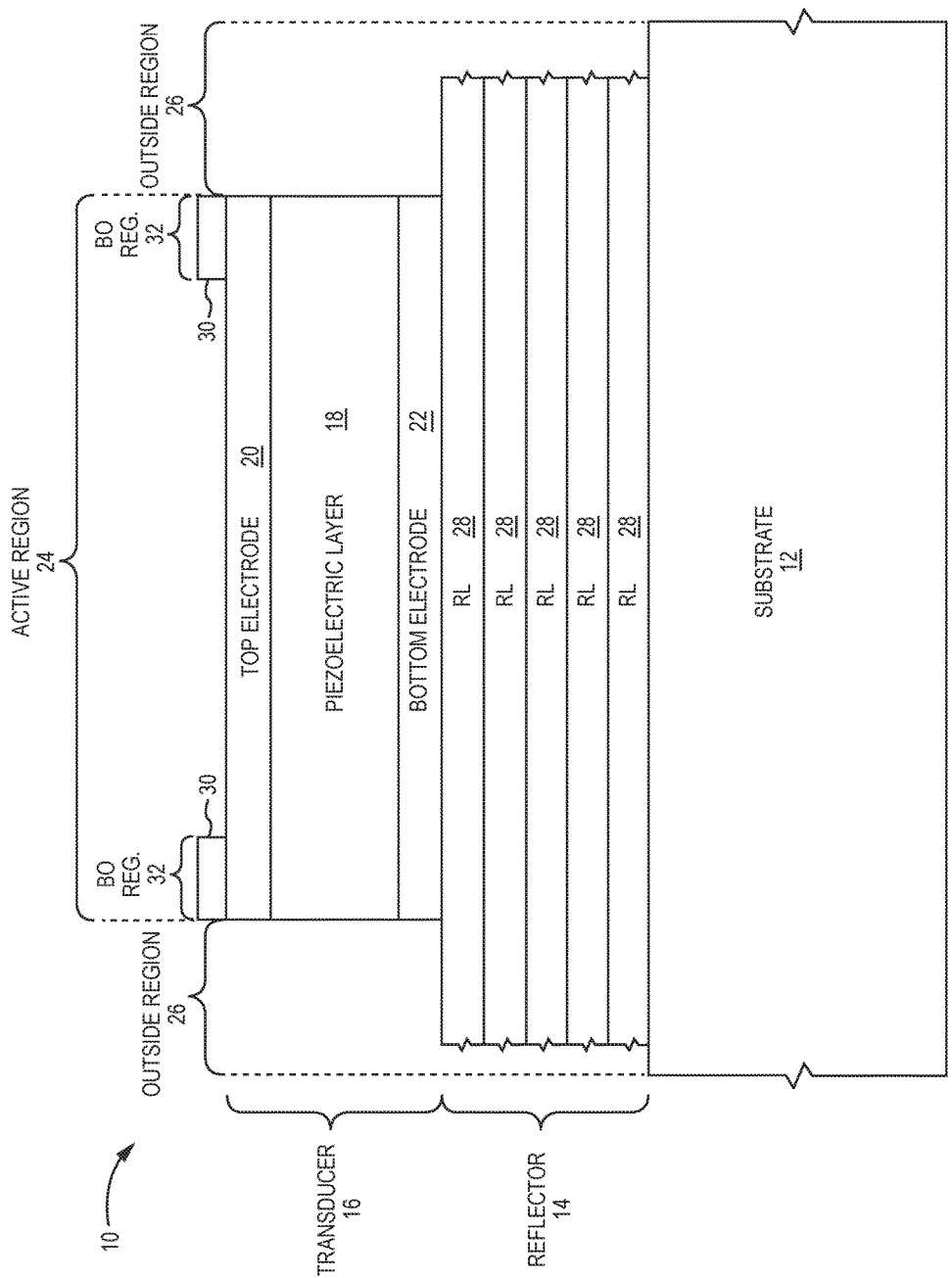
FIG. 4 illustrates a conventional Bulk Acoustic Wave (BAW) resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus the spurious mode, in the passband of the phase curve, which resides between the series resonance frequency ($f_s$) and the parallel resonance frequency ($f_p$). Circle B shows suppression of the ripple, and thus the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple free phase curve below the series resonance frequency ($f_s$). Assuming no BO ring 30 is provided, one can readily see in FIG. 3C that apodization fails to suppress those spurious modes above the series resonant frequency ($f_s$). As such, the typical BAW resonator 10 employs both apodization and the BO ring 30.

Figure 5A:
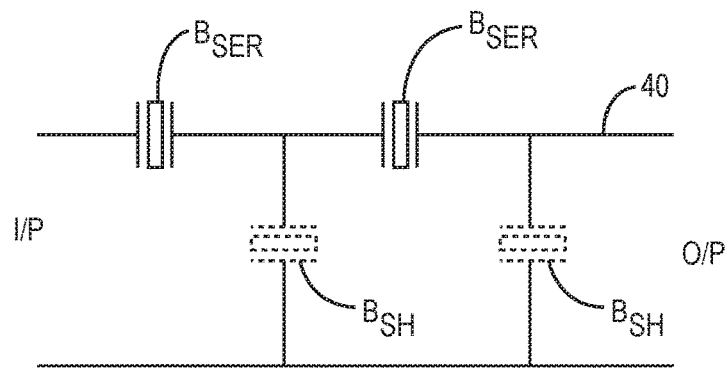
FIG. 5A is a schematic of a conventional ladder network.
Figure 5B:
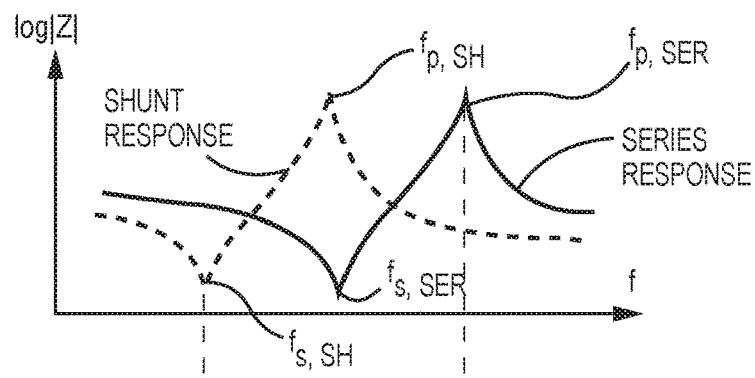
FIGS. 5B and 5C are graphs of a frequency response for BAW resonators in the conventional ladder network of FIG. 5A and a frequency response for the conventional ladder network of FIG. 5A.

As noted above, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different than the first frequency response, as shown in FIG. 5B. In many applications, the shunt resonators $B_{SH}$ are detuned versions of the series resonators $B_{SER}$. As a result, the frequency responses for the series resonators BSER and the shunt resonators BSH are generally very similar, yet shifted relative to one another such that the parallel resonance frequency ($f_{P,SH}$), of the shunt resonators approximates the series resonance frequency ($f_{S,SER}$), of the series resonators $B_{SER}$. Note that the series resonance frequency ($f_{S,SH}$) of the shunt resonators $B_{SH}$ is less than the series resonance frequency ($f_{S,SER}$) of the series resonators $B_{SER}$. The parallel resonance frequency ($f_{P,SH}$) of the shunt resonators $B_{SH}$ is less than the parallel resonance frequency ($f_{P,SER}$) of the series resonators $B_{SER}$.

Figure 5C:
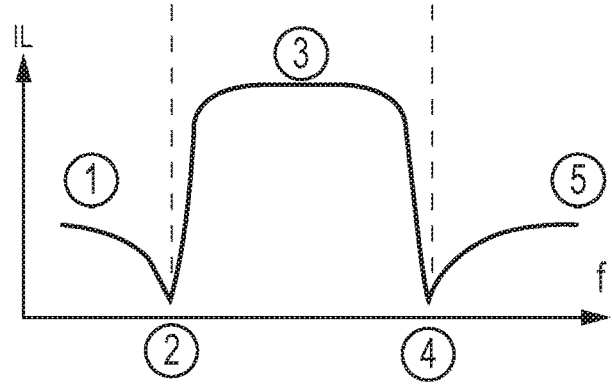

FIG. 5C is associated with FIG. 5B and illustrates the response of the ladder network 40. The series resonance frequency ($f_{S,SH}$) of the shunt resonators $B_{SH}$ corresponds to the low side of the passband's skirt (phase 2), and the parallel resonance frequency ($f_{P,SER}$) of the series resonators $B_{SER}$ corresponds to the high side of the passband's skirt (phase 4). The substantially aligned series resonance frequency ($f_{S,SER}$) of the series resonators $B_{SER}$ and the parallel resonance frequency ($f_{P,SH}$) of the shunt resonators $B_{SH}$ fall within the passband. FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{S,SH}$) of the shunt resonators $B_{SH}$ is approached, the impedance of the shunt resonators $B_{SH}$ drops precipitously, such that the shunt resonators $B_{SH}$ essentially provide a short to ground at the series resonance frequency ($f_{S,SH}$) of the shunt resonators (phase 2, FIGS. 5C, 6B). At the series resonance frequency ($f_{S,SH}$) of the shunt resonators $B_{SH}$ (phase 2), the input signal is essentially blocked from the output of the ladder network 40.

Figure 6A:
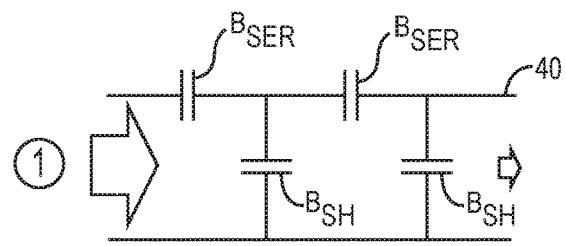
FIGS. 6A-6E are circuit equivalents for the ladder network of FIG. 5A at the frequency points 1, 2, 3, 4, and 5, which are identified in FIG. 5C.
Figure 6B:
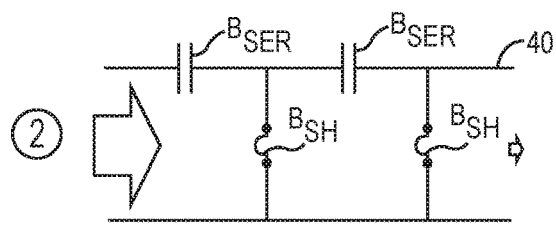
Figure 6C:
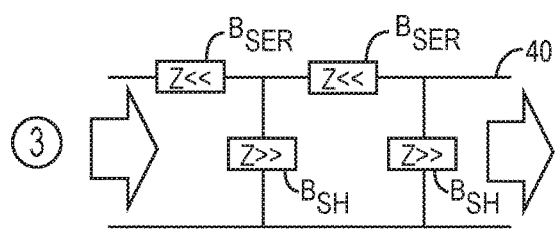
Figure 6D:
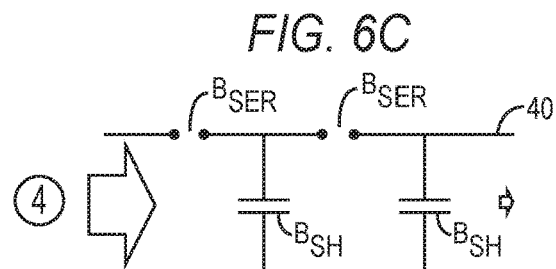
Figure 6E:
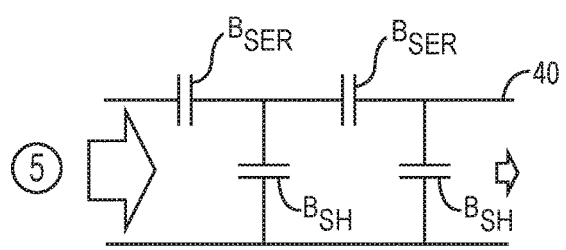

Between the series resonance frequency ($f_{S,SH}$) of the shunt resonators $B_{SH}$ and the parallel resonance frequency ($f_{P,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present a relatively low impedance, while the shunt resonators $B_{SH}$ present a relatively high impedance, wherein the combination of the two leads to a flat passband with steep low and high-side skirts. As the parallel resonance frequency ($f_{P,SER}$) of the series resonators $B_{SER}$ is approached, the impedance of the series resonators $B_{SER}$ becomes very high, such that the series resonators $B_{SER}$ essentially present themselves as open at the parallel resonance frequency ($f_{P,SER}$) of the series resonators (phase 4, FIGS. 5C, 6D). At the parallel resonance frequency ($f_{P,SER}$) of the series resonators $B_{SER}$ (phase 4), the input signal is again essentially blocked from the output of the ladder network 40. During the final phase (phase 5, FIGS. 5C, 6E), the ladder network 40 functions to attenuate the input signal, in a similar fashion to that provided in phase 1.

As the parallel resonance frequency ($f_{P,SER}$) of the series resonators $B_{SER}$ is passed, the impedance of the series resonators $B_{SER}$ decreases, and the impedance of the shunt resonators $B_{SH}$ normalizes. Thus, the ladder network 40 functions to provide a high Q passband between the series resonance frequency ($f_{S,SH}$) of the shunt resonators $B_{SH}$ and the parallel resonance frequency ($f_{P,SER}$) of the series resonators $B_{SER}$. The ladder network 40 provides extremely high attenuation at both the series resonance frequency ($f_{S,SH}$) of the shunt resonators $B_{SH}$ and the parallel resonance frequency ($f_{P,SER}$) of the series resonators. The ladder network 40 provides good attenuation below the series resonance frequency ($f_{S,SH}$) of the shunt resonators $B_{SH}$ and above the parallel resonance frequency ($f_{P,SER}$) of the series resonators $B_{SER}$.

Figure 7:
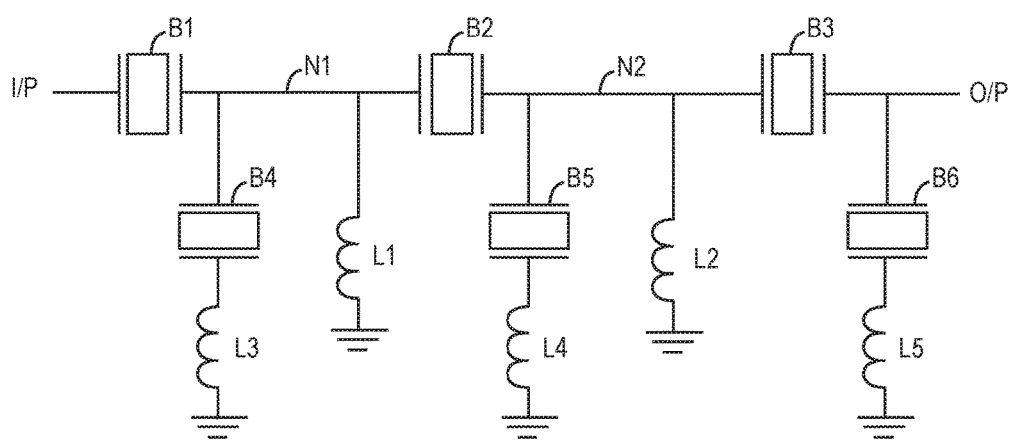
FIG. 7 illustrates a ladder network including shunt inductors.

While the ladder network 40 performs well, the need to perform over wider and wider bandwidths continues. One technique for extending the bandwidth of the ladder network 40 is illustrated in FIG. 7. In general, the ladder network 40 includes a series branch coupled between an input node (I/P) and an output node (O/P). The series branch has a multiple BAW resonators B1, B2, and B3 that are coupled in series, wherein one series resonator B2 is coupled between a first node N1 and a second node N2 in the series branch. Shunt resonators B4, B5, and B6 are respectively coupled between node N1, node N2, and the output node O/P to form three shunt resonator branches in a fashion similar to that of the ladder network 40, which was illustrated in FIG. 5A.

In an effort to increase bandwidth, shunt inductors L1 and L2 are respectively coupled between the first node N1 and ground and the second node N2 and ground, or other fixed voltage node. In effect, the shunt inductors L1 and L2 are respectively placed in parallel with the shunt resonators B4 and B5. Additional inductors L3, L4, and L5 may be placed in series with the resonators B4, B5, and B6, respectively, in each shunt branch in traditional fashion.

Figure 8:
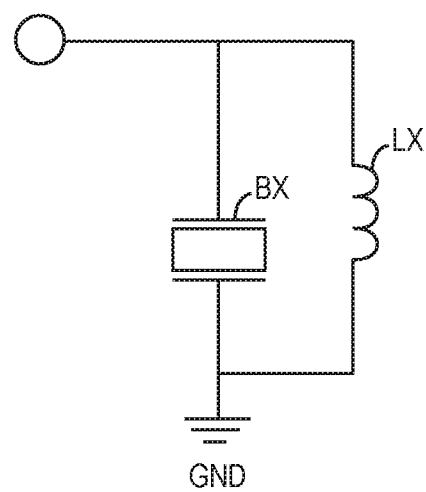
FIG. 8 is a schematic of a shunt inductor in parallel with a shunt BAW resonator.
Figure 9:
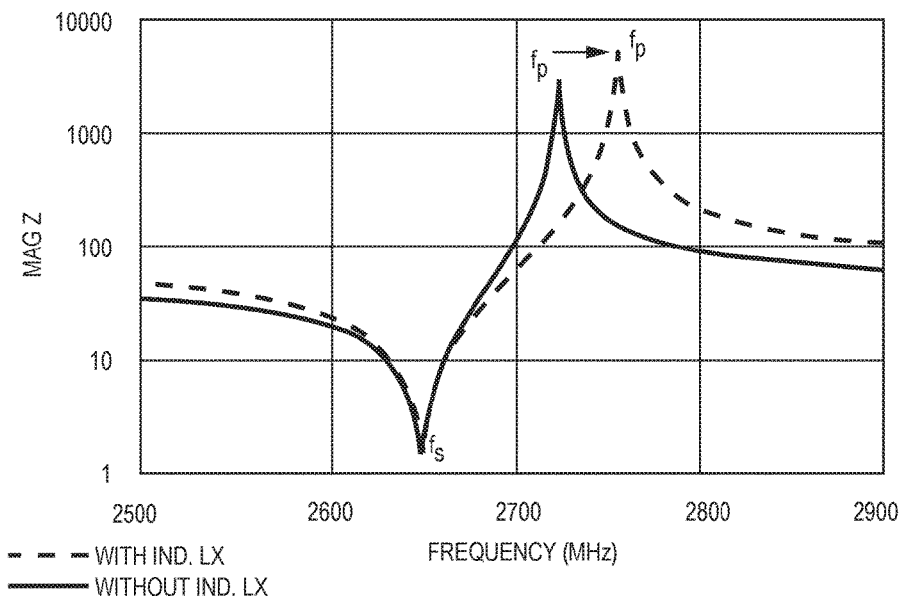
FIG. 9 is a graph of the impedance responses as a function of frequency over a narrow frequency range for an ideal BAW resonator and an ideal BAW resonator in parallel with an inductor.

A circuit model of a resonator BX in parallel with an inductor LX is shown in FIG. 8. Placing the inductor LX in parallel with the resonator BX functions to shift the parallel resonance frequency ($f_p$) higher while maintaining the series resonance frequency ($f_s$), as illustrated in FIG. 9. Widening the gap between the parallel resonance frequency ($f_p$) and the series resonance frequency ($f_s$) of the resonator BX directly corresponds to widening the bandwidth of a ladder network in which the resonator BX is employed, as described above in Association with FIGS. 5B and 5C.

Figure 10:
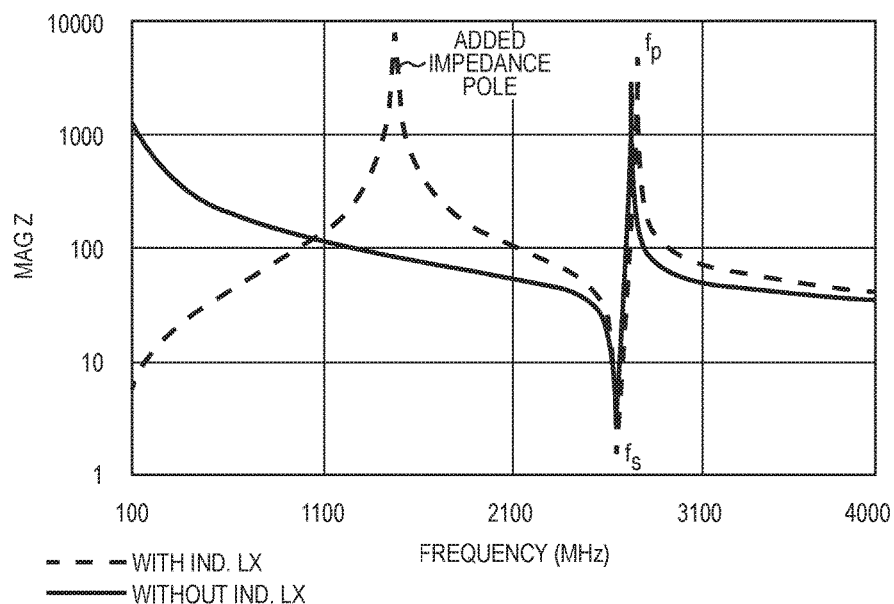
FIG. 10 is a graph of the impedance responses as a function of frequency over a broad frequency range for an ideal BAW resonator and an ideal BAW resonator in parallel with an inductor.
Figure 11:
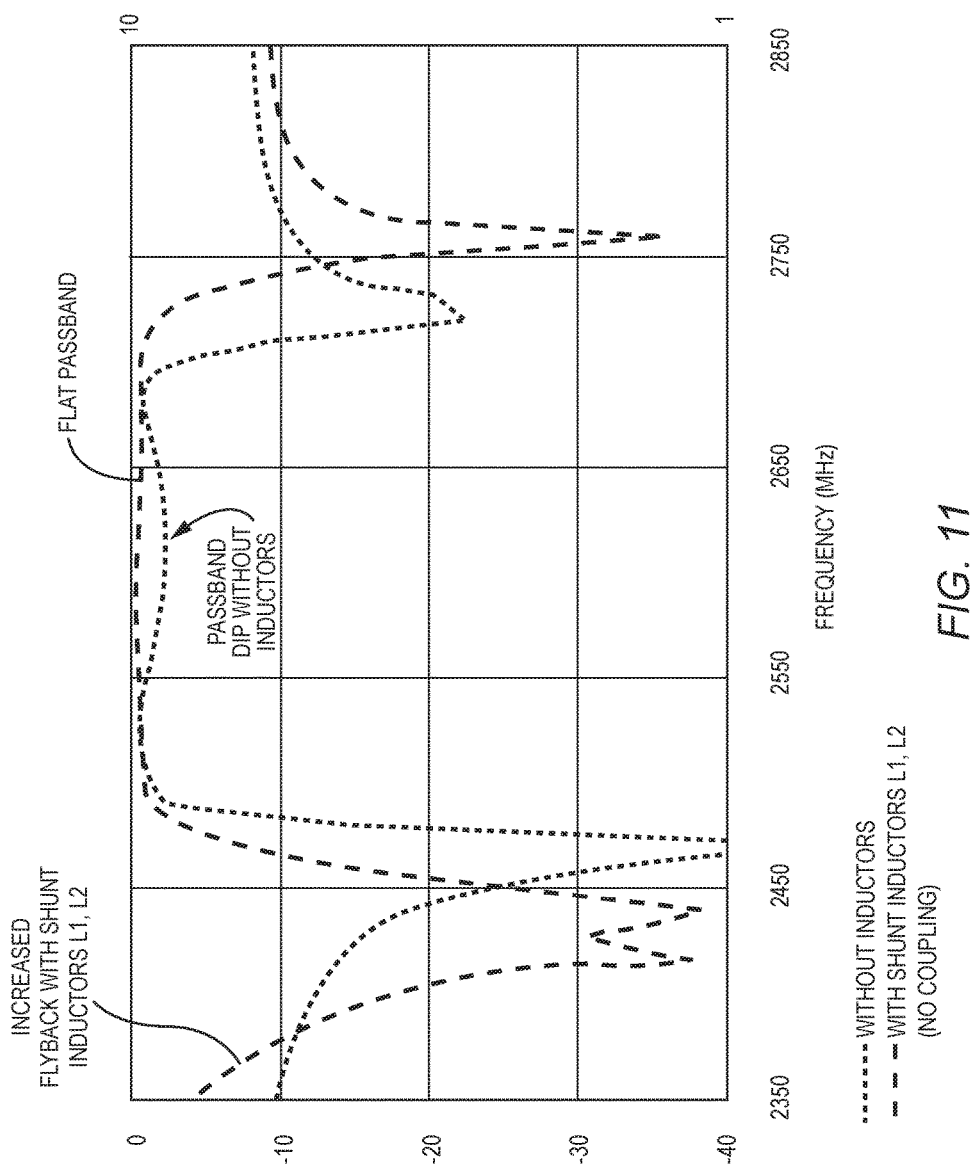
FIG. 11 is a graph of the passbands as a function of frequency over a narrow frequency range for ladder networks without shunt inductors and with shunt inductors that are not magnetically coupled.
Figure 12:
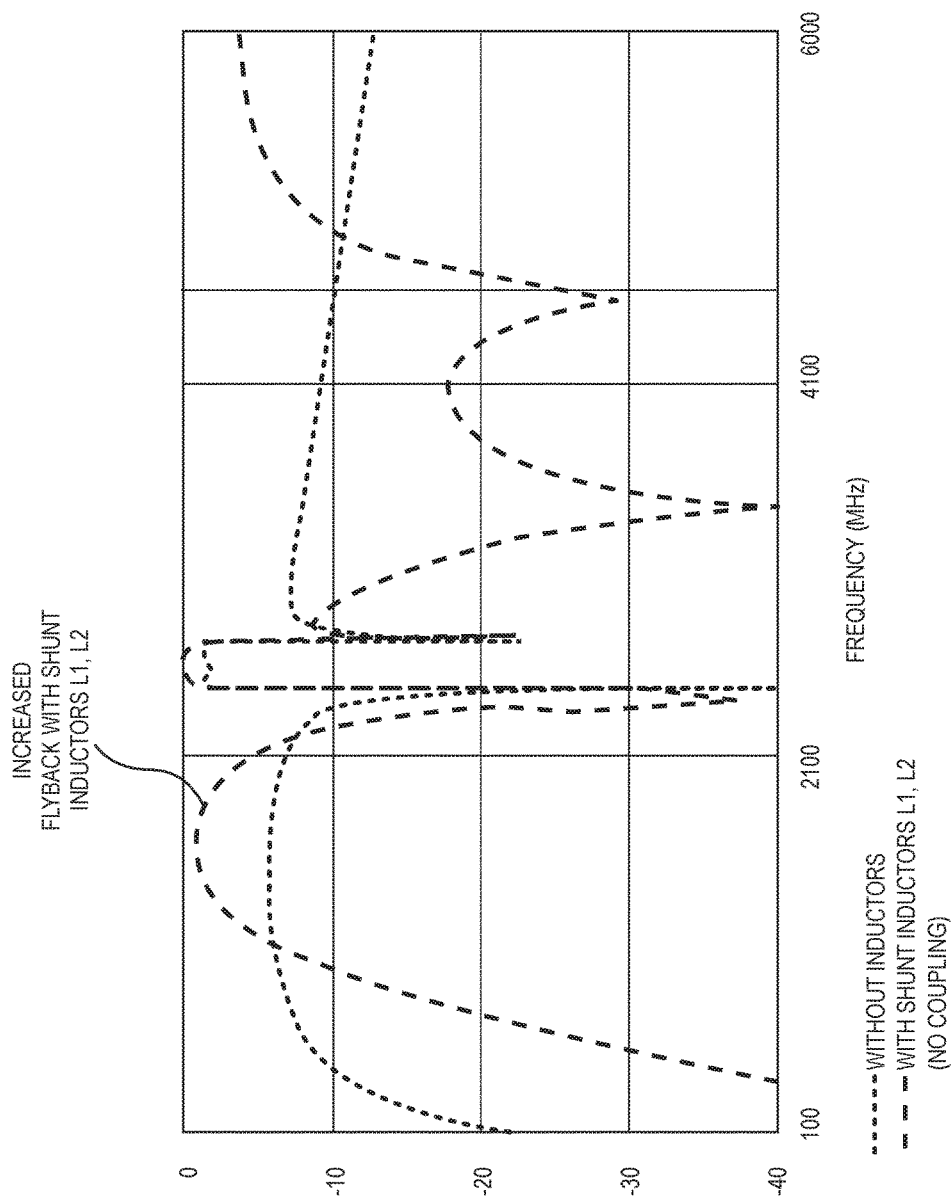
FIG. 12 is a graph of the passbands as a function of frequency over a broad frequency range for ladder networks without shunt inductors and with shunt inductors that are not magnetically coupled.

Unfortunately, the benefit of the increased gap between the parallel resonance frequency ($f_p$) and series resonance frequency ($f_s$), due to the addition of inductor LX comes at a cost, as illustrated in FIG. 10. The cost is the added presence of an impedance pole below the series resonance frequency ($f_s$). The additional impedance pole manifests itself in the transfer function of the ladder network, as illustrated in FIG. 11. FIG. 11 illustrates passbands for a ladder network that employs the shunt inductors L1 and L2 (dashed line) and a ladder network that does not employ the shunt inductors L1 and L2, but attempts to maximize the passband without the use of the shunt inductors L1 and L2 (dotted line). Notably, trying to maximize the passband without the use of the shunt inductors L1 and L2 results in a noticeable dip in the middle of the passband. However, the flyback (or balance) that appears below the passband remains sufficiently low, as illustrated in FIGS. 11 and 12. When the shunt inductors L1 and L2 are employed, the passband remains relatively flat, but the flyback that appears below the passband reaches levels that are unacceptable. The ladder networks described further below incorporate solutions that facilitate wider bandwidths, maintain relatively flat passbands, and reduce the flyback that appears below the passband in the transfer function of the ladder networks.

Figure 13:
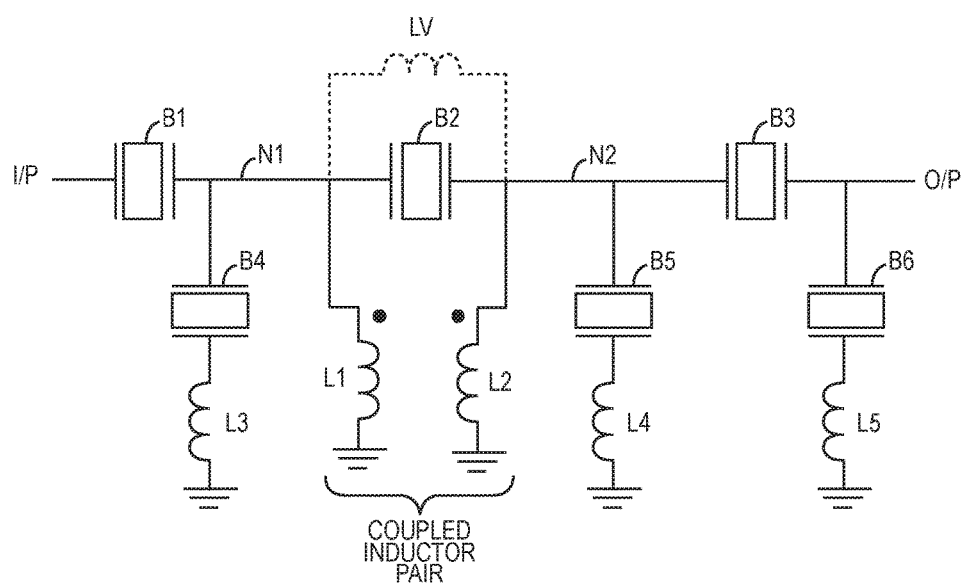
FIG. 13 illustrates a ladder network including shunt inductors, which are magnetically coupled to one another, according to a first embodiment.
Figure 14:
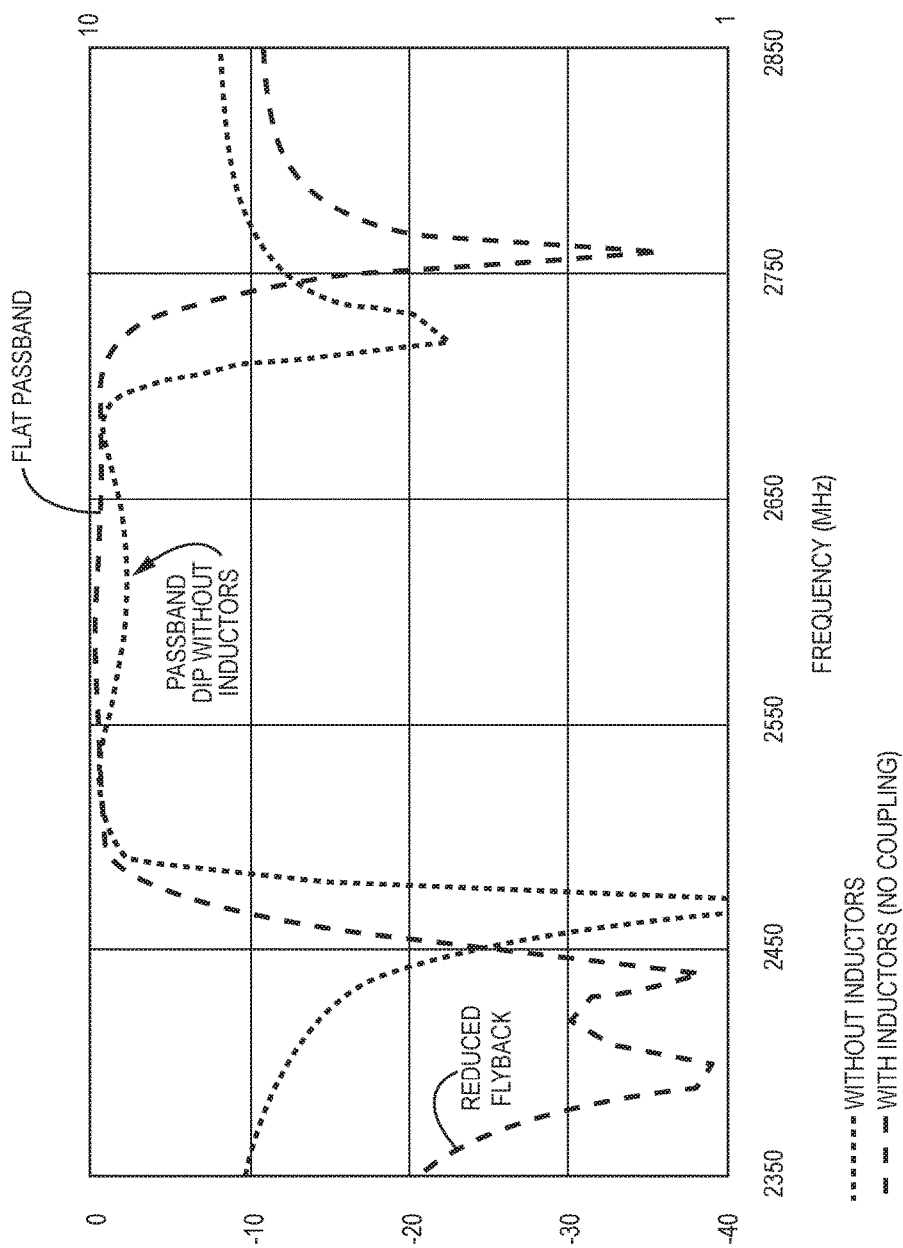
FIG. 14 is a graph of the passbands as a function of frequency over a narrow frequency range for ladder networks without shunt inductors and with shunt inductors that are magnetically coupled.
Figure 15:
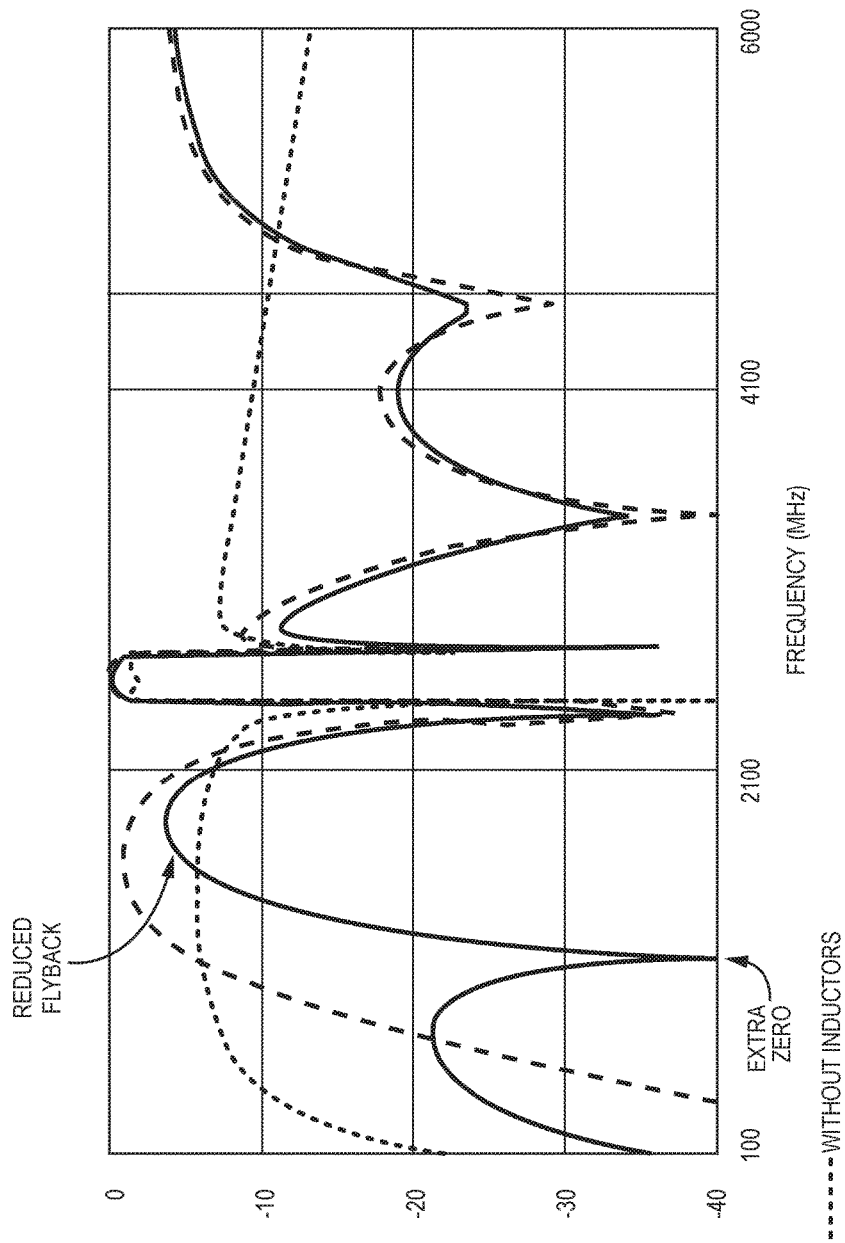
FIG. 15 is a graph of the passbands as a function of frequency over a broad frequency range for ladder networks without shunt inductors, with shunt inductors that are not magnetically coupled, and with shunt inductors that are magnetically coupled.

As illustrated in FIG. 13, these solutions include configuring and arranging the shunt inductors L1 and L2 such that they are intentionally magnetically coupled. The magnetic coupling coefficient, k, may be between 0.01 and 1, 0.1 and 1, 0.2 and 1, and 0.3 and 1, in different embodiments, wherein K=1 is a theoretical upper limit and practical upper limits for certain commercial embodiments in the range of 0.7 to 0.8 are envisioned for these ranges. By magnetically coupling the shunt inductors L1 and L2, a virtual inductance LV is formed between first node N1 and second node N2. In other words, the virtual inductance LV is formed in parallel with resonator B2, which resides in the series path between the input node I/P and the output node O/P. As illustrated in FIGS. 14 and 15, the passband remains wide and flat, while the flyback, which appears below the passband, is significantly reduced. As is apparent in FIG. 15, an extra zero is presented in the flyback region, which significantly aids rejection of signals below the passband. Discovery of the impact of magnetically coupling the shunt inductors L1 and L2 is an unexpected and significant advancement in the field of BAW-based ladder networks.

A pair of inductive elements is magnetically coupled when at least a portion of magnetic flux that is produced by a current in a first of the pair of inductive elements is linked to a second of the pair of inductive elements. The magnetic coupling coefficient, k, between a pair of inductive elements, such as the shunt inductors L1 and L2, is defined as the portion of magnetic flux that is produced by a current in a first of the pair of inductive elements that is linked to a second of the pair of inductive elements. Mathematically, the magnetic coupling coefficient is defined as—

I1=current in a first of the pair of inductive elements;

$\phi 1$=magnetic flux that is produced in the first of the pair of inductive elements by I1;

$\phi 12$=portion of $\phi 1$ that is linked to the second of the pair of inductive elements; and k=magnetic coupling coefficient is equal to or is generally proportional to $\phi 12/\phi 1$. k=0 means the pair of inductive elements are magnetically isolated, such that the pair of inductive elements are not magnetically coupled to one another. k=1 means the pair of inductive elements are perfectly magnetically coupled, such that the pair of inductive elements completely share the magnetic flux.

Figure 16:
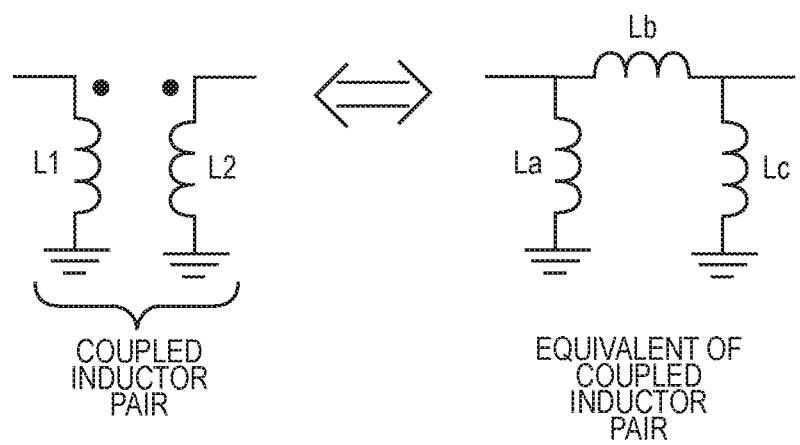
FIG. 16 is a schematic of a coupled inductor pair and an equivalent thereof.

The theory behind providing the virtual inductance LV by magnetically coupling the shunt inductors L1 and L2 follows. With reference to FIG. 16, the coupled inductor pair of shunt inductors L1 and L2 on the left can be modeled as the pi ($\pi$) network on the right. The pi network has a series inductor Lb and two shunt inductors La and Lc. The relationship between the shunt inductors L1 and L2 and the inductors La, Lb, and Lc of the equivalent pi network on the right is provided in the following equation, wherein L1, L2, La, Lb, and Lc represent inductance values for the corresponding inductors, and k is the magnetic coupling coefficient:

$$La = \frac{L1*L2(1-k^2)}{L2-k\sqrt{(L1*L2)}}$$

$$Lb = \frac{L1*L2(1-k^2)}{k\sqrt{(L1*L2)}}$$

$$Lc = \frac{L1*L2(1-k^2)}{L1-k\sqrt{(L1*L2)}}$$

Figure 17:
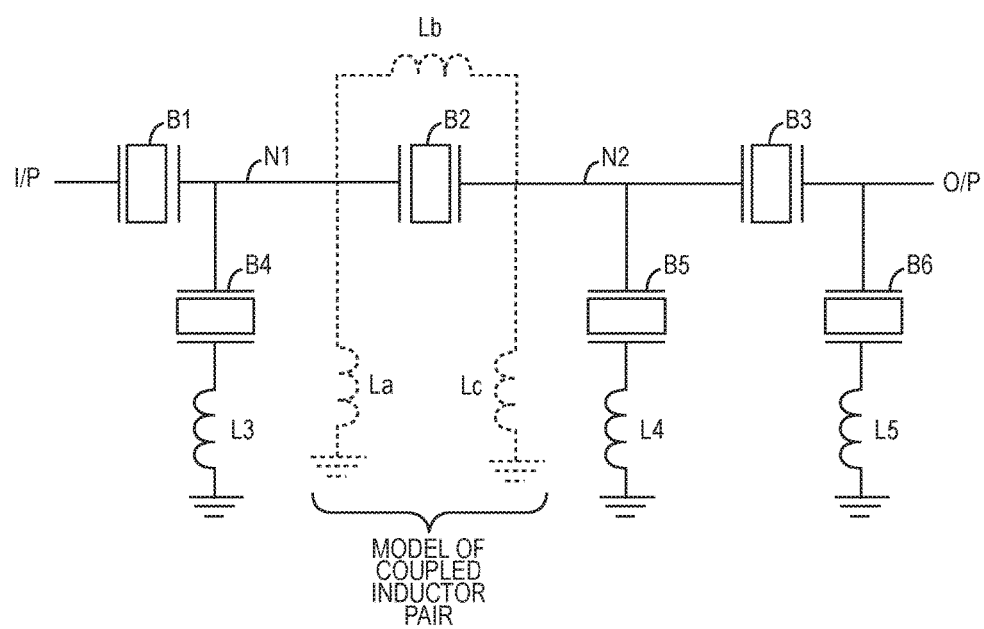
FIG. 17 illustrates an equivalent of a ladder network including shunt inductors, which are magnetically coupled to one another, according to a first embodiment.

Magnetically coupling the shunt inductors L1 and L2 will provide a virtual inductance LV, which corresponds to the inductance value of series inductor Lb, as well as change the effective inductance of the shunt inductors L1 and L2 to the inductance associated with inductors La and Lc, respectively. FIG. 17 illustrates the effective inductance values (La, Lb, and Lc) for the ladder network of FIG. 13, when the shunt inductors L1 and L2 are magnetically coupled.

The inductance of the coupled shunt inductors L1 and L2 may be same or different and will vary based on the application, desired bandwidth, location of the passband of the filter, and the like. For many embodiments operating at or above 2.4 GHz, the value of the virtual inductance is between 2 and 25 nH (nanohenries), the value of inductor L1 is between 2.5 and 4 nH, and the value of inductor L2 is between 0.8 and 15 nH. While beneficial for many communication bands, the concepts disclosed herein are particularly beneficial for filters that require bandpass passbands over 150 MHz, flat passbands, and step skirts. A prime example is the approximately 194 MHz band allocated for the Long Term Evolution Time Division Duplex (LTE TDD) band that resides at 2.5 GHz (LTE Band 41). Other examples include LTE bands 42 and 43 that require approximately 200 MHz bandwidths at 3.5 GHz and 3.7 GHz. In certain embodiments, the passbands range between 100 GHz and 300 GHz; 150 GHz and 250 GHz; 150 GHz and 300 GHz, and the like, at frequencies greater than 2 GHz, which extend to 7 GHz and beyond.

Figure 18:
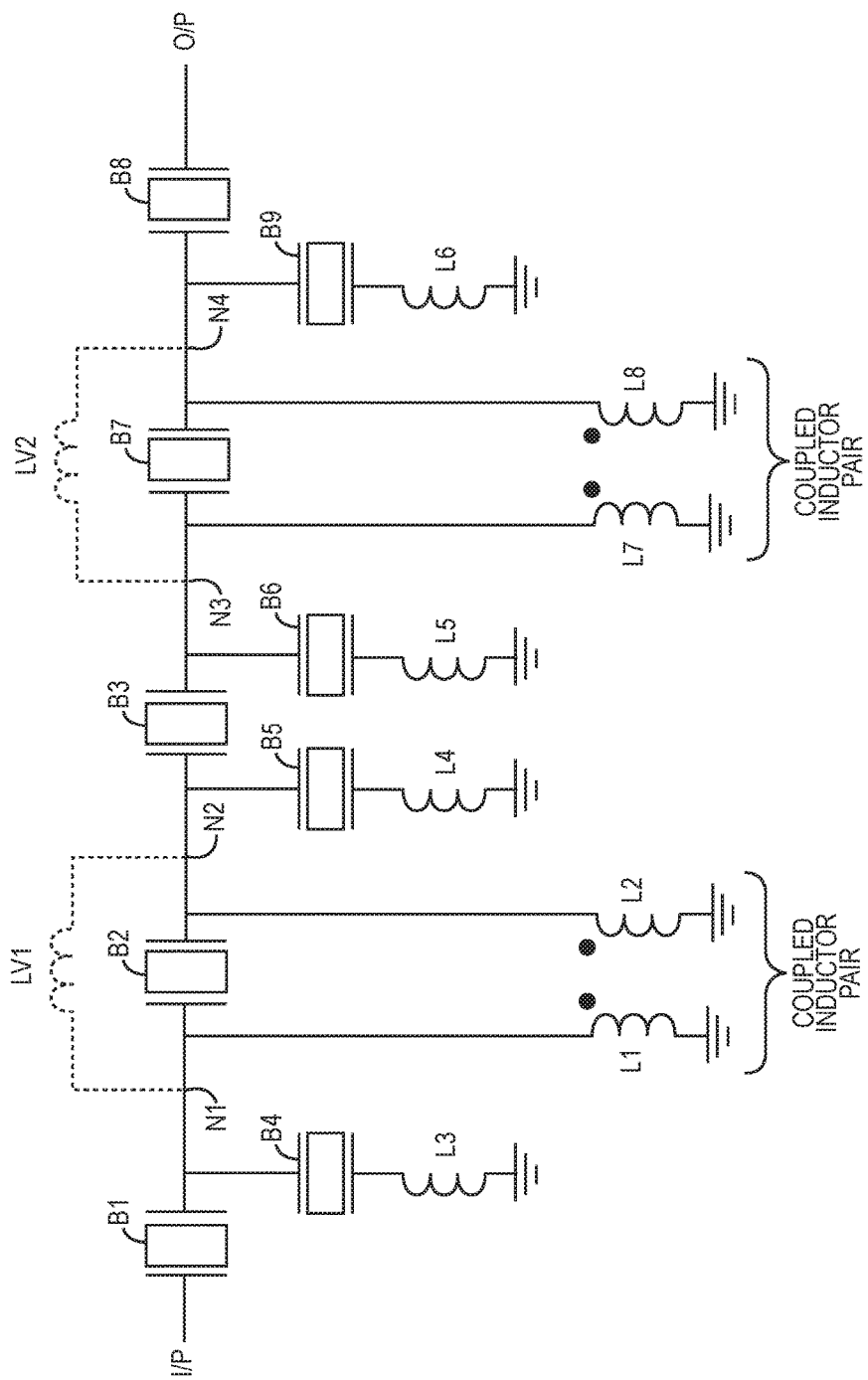
FIG. 18 illustrates a ladder network including shunt inductors, which are magnetically coupled to one another, according to a second embodiment.
Figure 19:
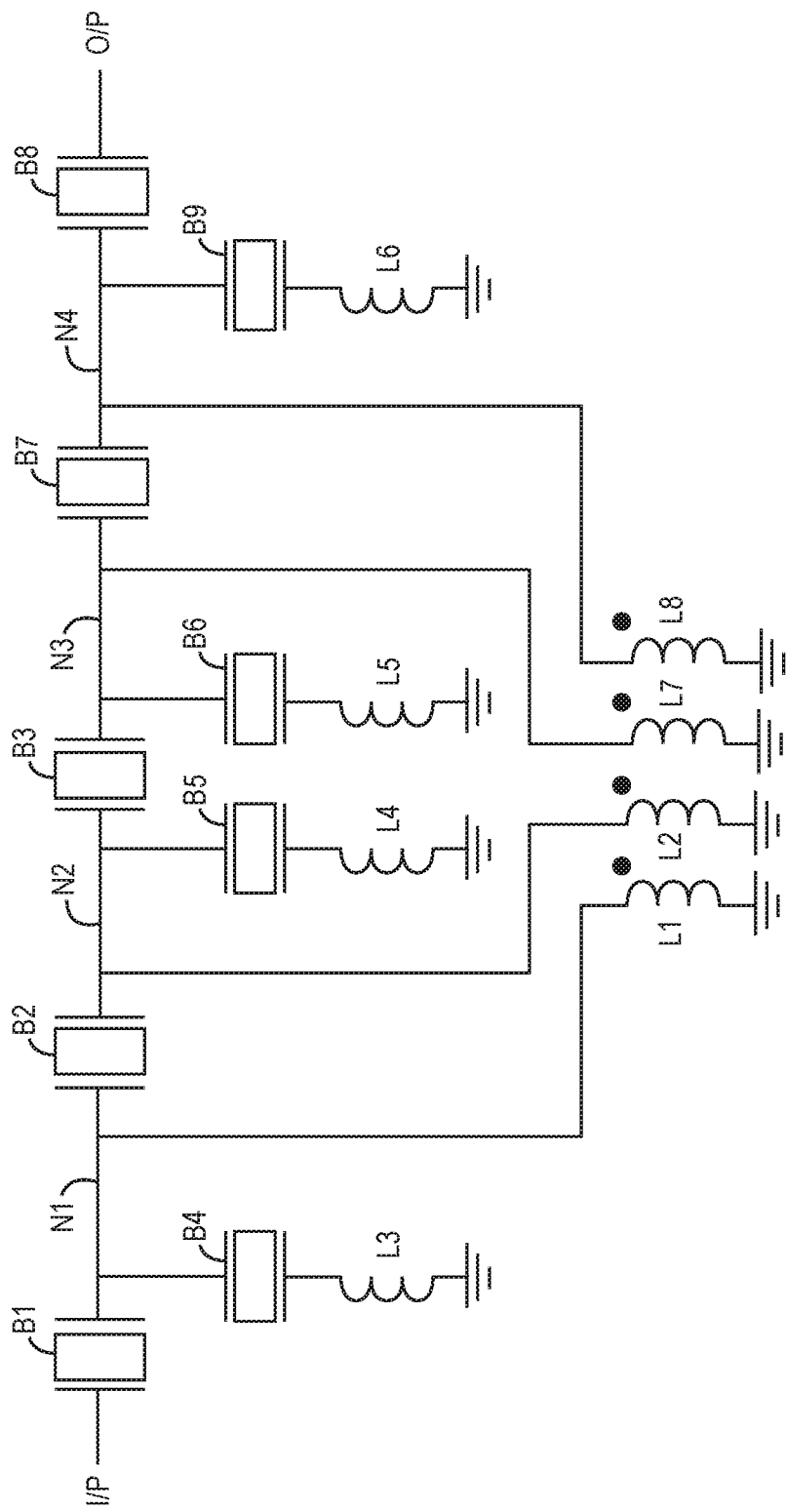
FIG. 19 illustrates a ladder network including shunt inductors, which are magnetically coupled to one another, according to a third embodiment.
Figure 20:
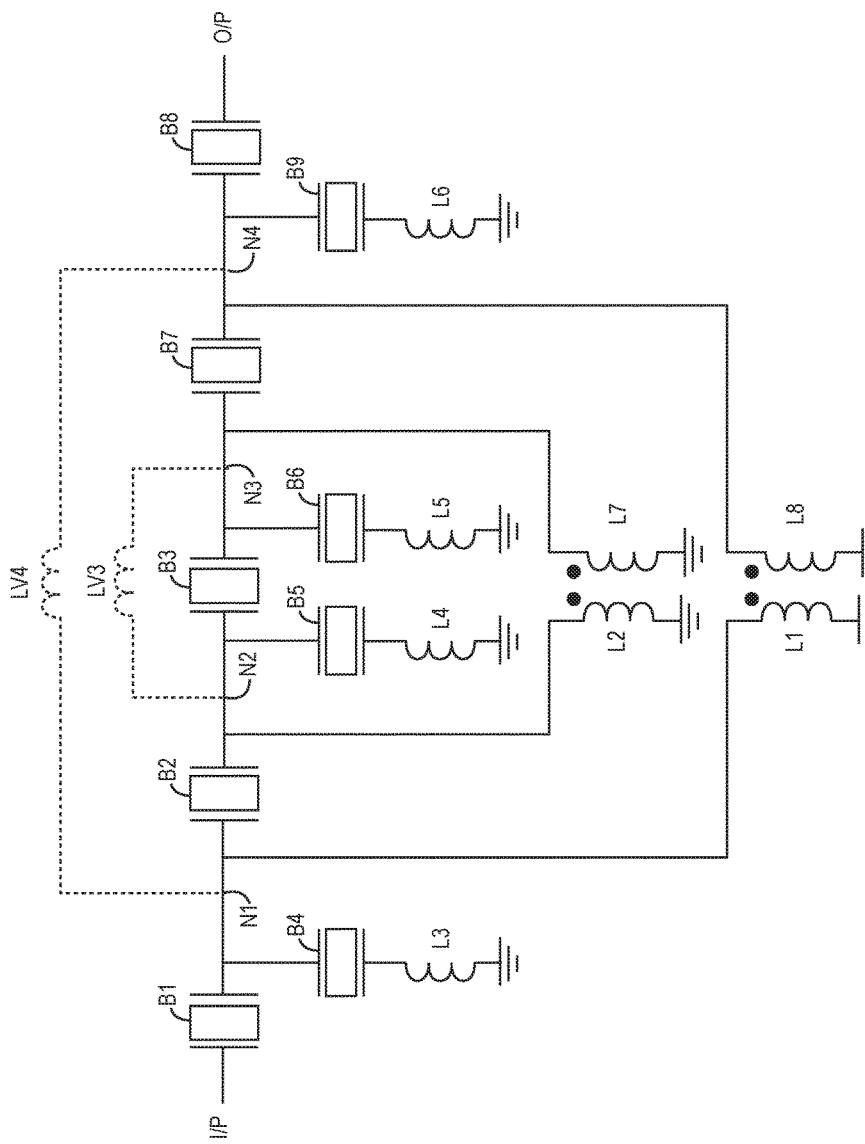
FIG. 20 illustrates a ladder network including shunt inductors, which are magnetically coupled to one another, according to a fourth embodiment.

The above concepts may be extended to more complex and sophisticated ladder networks, such as those illustrated in FIGS. 18, 19, 20. With particular reference to FIG. 18, the ladder network is an extension of that illustrated in FIG. 13 and includes a series branch coupled between an input node (I/P) and an output node (O/P). The series branch has a multiple BAW resonators B1, B2, B3, B7, and B8 that are coupled in series. For reference, series resonator B2 is coupled between a first node N1 and a second node N2, and series resonator B7 is coupled between a third node N3 and a fourth node N4 in the series branch. Shunt resonators B4, B5, B6, and B9 are respectively coupled between first node N1, second node N2, third node N3, and fourth node N4 to form four shunt resonator branches in a fashion similar to that of the ladder network illustrated in FIG. 13.

Like in FIG. 13, shunt inductors L1 and L2 are respectively coupled between the first node N1 and ground and the second node N2 and ground. Shunt inductors L7 and L8 are respectively coupled between the third node N3 and ground and the fourth node N4 and ground. Ground may represent actual ground or other fixed voltage node. Additional inductors L3, L4, L5, and L6 may be placed in series with the resonators B4, B5, B6, and B9, respectively.

For the embodiment of FIG. 18, shunt inductors L1 and L2 are intentionally magnetically coupled with one another, and shunt inductors L7 and L8 are intentionally magnetically coupled with one another. Shunt inductors L7 and L8 are not magnetically coupled to either of shunt inductors L1 and L2. Similarly, shunt inductors L1 and L2 are not magnetically coupled to either of shunt inductors L7 and L8. Thus, two separate, coupled inductor pairs are provided. The magnetic coupling coefficient, k, for each coupled inductor pair (L1/L2 and L7/L8) may be between 0.1 and 1, 0.2 and 1, and 0.3 and 1, in different embodiments. By magnetically coupling the shunt inductors L1 and L2, a virtual inductance LV1 is formed between first node N1 and second node N2 and in parallel with resonator B2, which resides in the series path between the input node I/P and the output node O/P. By magnetically coupling the shunt inductors L7 and L8, a virtual inductance LV2 is formed between third node N3 and fourth node N4 and in parallel with resonator B7, which also resides in the series path between the input node I/P and the output node O/P.

The ladder network of FIG. 19 is similar to the ladder network of FIG. 18, except all of the shunt inductors L1, L2, L7, and L8 are magnetically coupled to each other, as opposed to being broken into two separate, coupled inductor pairs. As a result, virtual inductances are provided between the first node N1 and the second node N2, the first node N1 and the third node N3, the first node N1 and the fourth node N4, the second node N2 and the third node N3, the second node N2 and the fourth node N4, and the third node N3 and the fourth node N4. For clarity, these virtual inductances are not illustrated, but will be apparent to those skilled in the art upon reading this disclosure.

The ladder network of FIG. 20 is similar to the ladder network of FIG. 18, except shunt inductors L2 and L7 are intentionally magnetically coupled to form a first coupled inductor pair, and shunt inductors L1 and L8 are intentionally magnetically coupled to form a second coupled inductor pair. Shunt inductors L2 and L7 are not intentionally magnetically coupled to either of shunt inductors L1 and L8. Similarly, shunt inductors L1 and L8 are not intentionally magnetically coupled to either of shunt inductors L2 and L7.

The magnetic coupling coefficient, k, for each coupled inductor pair (L1/L2 and L7/L8) may be between 0.1 and 1, 0.2 and 1, and 0.3 and 1, in different embodiments. By magnetically coupling the shunt inductors L2 and L7, a virtual inductance LV3 is formed between second node N2 and third node N3 and in parallel with resonator B3, which resides in the series path between the input node I/P and the output node O/P. By magnetically coupling the shunt inductors L1 and L8, a virtual inductance LV4 is formed between first node N1 and fourth node N4 and in parallel with the string of series coupled resonators B2, B3, and B7, which also resides in the series path between the input node I/P and the output node O/P.

The above described embodiments are for illustrative purposes only and are not intended to be exhaustive. The concepts described herein may be implemented in various ladder networks of varying degrees of complexity and configuration.

What is claimed is:

1. A Bulk Acoustic Wave (BAW) filter comprising:
    a series branch coupled between an input node and an output node, wherein the series branch comprises a plurality of BAW resonators that are coupled in series such that a first series resonator of the plurality of BAW resonators is coupled between a first node and a second node in the series branch, wherein the first node and the second node are in series with and between a second series resonator and a third series resonator of the plurality of BAW resonators in the series branch, and a third node in the series branch is coupled between the third series resonator and a fourth series resonator of the plurality of BAW resonators;
    a first shunt resonator coupled between the first node and a fixed voltage node;
    a second shunt resonator coupled between the second node and the fixed voltage node;
    a first shunt inductor coupled between the first node and the fixed voltage node;
    a second shunt inductor coupled between the second node and the fixed voltage node, wherein the first shunt inductor and the second shunt inductor are magnetically coupled to one another to generate a first virtual inductance between the first node and the second node and in parallel with the first series resonator; and
    a third shunt inductor coupled between the third node and the fixed voltage node, wherein the third shunt inductor is magnetically isolated from the first shunt inductor and the second shunt inductor.

2. The BAW filter of claim 1 wherein the fourth series resonator of the plurality of BAW resonators is coupled between the third node and a fourth node in the series branch and further comprising:
    a third shunt resonator coupled between the third node and the fixed voltage node;
    a fourth shunt resonator coupled between the fourth node and the fixed voltage node;
    and
    a fourth shunt inductor coupled between the fourth node and the fixed voltage node, wherein the third shunt inductor and the fourth shunt inductor are magnetically coupled to one another to generate a second virtual inductance between the third node and the fourth node and in parallel with the fourth series resonator.

3. The BAW filter of claim 2 wherein the third series resonator of the plurality of BAW resonators is coupled between the second node and the third node in the series branch.

4. The BAW filter of claim 2 wherein the first shunt inductor and the second shunt inductor are magnetically isolated from the third shunt inductor and the fourth shunt inductor.

5. The BAW filter of claim 2 wherein a bandwidth of a passband of the BAW filter is between 150 GHz and 300 GHz at frequencies between 2 GHz and 7 GHz.

6. The BAW filter of claim 2 wherein an inductance of the first shunt inductor and an inductance of the second shunt inductor are different.

7. The BAW filter of claim 1 wherein the BAW filter is a ladder network that provides a bandpass filter.

8. The BAW filter of claim 7 wherein a bandwidth of a passband of the bandpass filter is greater than 150 GHz at frequencies greater than 2 GHz.

9. The BAW filter of claim 7 wherein a bandwidth of a passband of the bandpass filter is between 150 GHz and 300 GHz.

10. The BAW filter of claim 7 wherein a bandwidth of a passband of the bandpass filter is between 150 GHz and 300 GHz at frequencies between 2 GHz and 7 GHz.

11. The BAW filter of claim 1 wherein the fourth series resonator of the plurality of BAW resonators is coupled between the third node and a fourth node in the series branch and further comprising:
    a third shunt resonator coupled between the third node and the fixed voltage node;
    a fourth shunt resonator coupled between the fourth node and the fixed voltage node;
    and
    a fourth shunt inductor coupled between the fourth node and the fixed voltage node, wherein the third shunt inductor and the fourth shunt inductor are magnetically coupled to one another to generate a second virtual inductance between the third node and the fourth node.

12. The BAW filter of claim 11 wherein the third series resonator of the plurality of BAW resonators is coupled between the second node and the third node in the series branch.

13. The BAW filter of claim 11 wherein a bandwidth of a passband of the BAW filter is between 150 GHz and 300 GHz at frequencies between 2 GHz and 7 GHz.

14. The BAW filter of claim 11 wherein an inductance of the first shunt inductor and an inductance of the second shunt inductor are different.

15. The BAW filter of claim 1 wherein an inductance of the first shunt inductor is different than an inductance of the second shunt inductor.

16. The BAW filter of claim 15 wherein the inductance of the first shunt inductor is in a range of 2.5 nanohenries to 4 nanohenries, and the inductance of the second shunt inductor is in a range of 0.8 to 3 nanohenries.

17. The BAW filter of claim 1 wherein an inductance of the first shunt inductor and the second shunt inductor are essentially the same.

18. The BAW filter of claim 1 wherein an inductance of the first shunt inductor is in a range of 2.5 nanohenries to 4 nanohenries and an inductance of the second shunt inductor is in a range of 0.8 to 3 nanohenries.

19. The BAW filter of claim 1 wherein the first virtual inductance is in a range of 2 nanohenries to 25 nanohenries.

20. The BAW filter of claim 1 wherein a first additional inductor is coupled in series with the first shunt resonator, and a second additional inductor is coupled in series with the second shunt resonator.

21. The BAW filter of claim 1 wherein a magnetic coupling coefficient between the first shunt inductor and the second shunt inductor is between 0.1 and 1.

22. The BAW filter of claim 1 wherein a magnetic coupling coefficient between the first shunt inductor and the second shunt inductor is between 0.2 and 1.

* * * * *